(12) United States Patent
Winderl et al.

(10) Patent No.: US 7,008,493 B2
(45) Date of Patent: Mar. 7, 2006

(54) METHOD FOR APPLYING A SEMICONDUCTOR CHIP TO A CARRIER ELEMENT

(75) Inventors: Johann Winderl, Neunburg v.W. (DE); Christian Hauser, Regensburg (DE); Martin Reiss, Regensburg (DE)

(73) Assignee: Infineon Technologies AG, Munich (DE)

( * ) Notice: Subject to any disclaimer, the term of this patent is extended or adjusted under 35 U.S.C. 154(b) by 278 days.

(21) Appl. No.: 10/685,065

(22) Filed: Oct. 14, 2003

(65) Prior Publication Data

US 2004/0074585 A1    Apr. 22, 2004

Related U.S. Application Data

(62) Division of application No. 09/809,860, filed on Mar. 16, 2001, now Pat. No. 6,664,648.

(30) Foreign Application Priority Data

Mar. 16, 2000   (DE)   ................................ 100 12 882

(51) Int. Cl.
  *B32B 21/60*   (2006.01)
(52) U.S. Cl. ...................... 156/79; 156/275.5; 438/118
(58) Field of Classification Search .................. 156/78, 156/79, 272.2, 275.5, 275.7; 29/830, 832, 29/739, 740; 438/118
See application file for complete search history.

(56) References Cited

U.S. PATENT DOCUMENTS

| 5,148,265 | A | 9/1992 | Khandros et al. |
| 5,786,271 | A | 7/1998 | Ohida et al. |
| 5,977,621 | A | 11/1999 | Stuck |
| 6,069,024 | A | 5/2000 | Murakami |
| 6,406,990 | B1 | 6/2002 | Kawai |
| 6,414,397 | B1 | 7/2002 | Sawamoto |
| 6,486,003 | B1 * | 11/2002 | Fjelstad ...................... 438/117 |

FOREIGN PATENT DOCUMENTS

| JP | 05-190705 | 7/1993 |
| WO | WO 97/27624 | 7/1997 |
| WO | WO 97/40958 | 11/1997 |

* cited by examiner

*Primary Examiner*—John T. Haran
(74) *Attorney, Agent, or Firm*—Laurence A. Greenberg; Werner H. Stemer; Ralph E. Locher

(57) ABSTRACT

A method is described for applying an integrated circuit to a carrier element. In which a curable compensating layer of initially paste-like consistency is coated substantially with full coverage onto a lower contact area of the integrated circuit. Whereupon the integrated circuit is joined together, by the compensating layer, with the carrier element after a relative alignment in order then to produce an electrical connection between the integrated circuit and conductor tracks of the carrier element via electrical lines surmounting the thickness of the compensating layer. Whereupon the compensating layer is cured resulting in an increased volume of the compensating layer.

7 Claims, 1 Drawing Sheet

METHOD FOR APPLYING A SEMICONDUCTOR CHIP TO A CARRIER ELEMENT

CROSS-REFERENCE TO RELATED APPLICATIONS

This application is a divisional of U.S. application Ser. No. 09/809,860 now U.S. Pat. No. 6,664,648, filed Mar. 16, 2001.

BACKGROUND OF THE INVENTION

Field of the Invention

The invention relates to a method for applying an integrated circuit to a carrier element.

In order to produce a mechanical and electrical incorporation of an integrated circuit within the circuit of an electronic device, it is possible to connect integrated circuits to a carrier element in a generally known way, in a manner that saves space and material, by use of "chip-size/scale-packaging (CPS)," or the like. In this case, by way of example, a flexible rewiring sheet can be used as the carrier element. The rewiring sheet may contain a polyimide film having a thickness of approximately 50 micrometers with copper conductor tracks having a thickness of approximately 15 micrometers. In order to minimize thermomechanical stresses on account of operation-dictated or mounting-dictated temperature differences between the integrated circuit and the carrier element, an interspace between the two elements is usually filled with a compensating layer. The compensating layer takes up the undesirable stresses, thereby effectively reducing in particular the risk of tearing of electrical lines connecting the integrated circuit to the carrier element at the contact-mating points.

International Patent Disclosure WO 97/40958 discloses a method for applying an integrated circuit to a carrier element which underfills the interspace to create the compensating layer that takes up stress. For this purpose, the integrated circuit is applied by use of spacer silicone spots on the carrier element in order to define the width of the interspace. Afterward, the electrical connection between the integrated circuit and the carrier element is produced by breaking out conductor track sections from prefabricated perforations in the carrier element, followed by fastening to corresponding contact points on the integrated circuit. In this case, the fastening is effected by a "bonding method". Next, with pressure shut off, an initially flowable material is introduced into the interspace by the action of negative pressure, which material finally cures to form the compensating layer.

In this case, it is disadvantageous that complex preconditions in terms of equipment are necessary for underfilling the integrated circuit by the action of negative pressure in order to guarantee that the interspace is completely filled. Furthermore, the flowability of the material of the compensating layer must always be ensured during the underfilling process. Therefore, this known solution for applying the integrated circuit to the carrier element requires a multiplicity of method steps that altogether cause a time-consuming mounting process.

International Patent Disclosure WO 97/27624 discloses an apparatus for underfilling the interspace which requires fewer production steps in comparison with the above. A mold is placed like a cup over the integrated circuit that is connected to the carrier element electrically and mechanically at a distance, the mold surrounds the integrated circuit and the edge of the mold bears on the carrier element. An injection device disposed thereon promptly forces a flowable material into the interspace, the flowable material forming the compensating layer in the cured state. Since the underfilling is effected by excess pressure in this respect, it is not necessary here to produce a negative pressure in the interspace. Although comparatively fewer production steps are necessary using the apparatus, so that a somewhat shorter mounting time can be realized, the apparatus for underfilling is nonetheless altogether extremely costly and complicated in its construction.

SUMMARY OF THE INVENTION

It is accordingly an object of the invention to provide a method and an apparatus for applying a semiconductor chip to a carrier element that overcome the above-mentioned disadvantages of the prior art methods and devices of this general type, which enables a simplification in the production while achieving an optimal stress-absorbing function of the compensating layer.

With the foregoing and other objects in view there is provided, in accordance with the invention, a method for applying a first device to a second device. The method includes providing an integrated circuit having a lower contact area and a carrier element having conductor tracks. A curable compensating layer having an initially pasty consistency is coated with full coverage onto the lower contact area of the integrated circuit or onto the carrier element. The integrated circuit is subsequently joined in an adhering manner, due to the curable compensating layer, to the carrier element after relative alignment. An electrical connection is produced between the integrated circuit and the conductor tracks of the carrier element via electrical lines surmounting a thickness of the curable compensating layer. The curable compensating layer is cured which results in an increased volume of the curable compensating layer.

The invention thus advantageously departs from the underfilling technique employed in the prior art and takes a new path in that the coating of the material which forms the compensating layer in the cured state is effected before the electrical contact-making. As a result, in particular the first method step of the interspace-forming attachment of the integrated circuit—for example by silicone spots—is entirely obviated, thereby considerably simplifying production. The basis for forming the compensating layer is also advantageously produced at the same time as the application of the integrated circuit to the carrier element. Reliable filling of the interspace is guaranteed by the curing of the compensating layer with an increase in volume. Overall, the method according to the invention shortens the mounting time.

A further measure that improves the invention consists in the electrical lines initially being fastened in an untautened manner between the integrated circuit and the carrier element. The electrical lines are tautened, i.e. straightened up in disposition relative to the surface of the carrier element, only during the increase in volume of the compensating layer. In this case, the length of the tautened lines corresponds to a minimum thickness of the compensating layer that must be present in order to be able to compensate for the stresses that occur. In the untautened state, the electrical lines are configured for example as arcuately shaped, loose small copper strips.

The increase in volume of the compensating layer can be brought about in various ways. This can be effected by introducing a gas during the coating process or during the curing process. Alternatively, the volume of the compensating layer can also be increased by a substance which liberates gas (during the curing process) and is admixed with the base material.

Preferably, the volume-increasing process can be initiated by increasing the temperature of the compensating layer during the curing process or irradiating the compensating layer with ultraviolet light or in another suitable way. A heating device or a UV lamp can be used for this purpose. In addition, a temperature increase can also be effected by an exothermic reaction of the material of the compensating layer during the curing process. Separate temperature-increasing devices are not necessary in this case.

It is advantageous if, in the method according to the invention, the electrical lines are fastened by a conventional bonding method, in order to ensure rapid and reliable contact-making of the integrated circuit with the geometrical dimensions given here. Thus, by way of example, "lead bonding", "laser bonding" or "thermocompression bonding" can be employed as the bonding method.

The above-described method for applying an integrated circuit—which can also be fabricated by chip wafer technology—to a carrier element can preferably be carried out using an apparatus which contains a device for substantially full-coverage coating of a curable, adhesive compensating layer onto a lower contact area of the integrated circuit. In this case, the coating device may be a type of pressure-actuable cylinder configuration with an outlet opening or a configuration for printing. Furthermore, the apparatus contains a placement device—for example a pick-and-place device—for joining together, in an aligned manner, the integrated circuit with the carrier element by the adhering compensating layer. A wiring device—in particular a bonding device—serves for electrically connecting the integrated circuit to conductor tracks of the carrier element via electrical lines surmounting the thickness of the compensating layer. The wiring device forms the electrical lines, which are preferably configured as small copper strips, from the conductor tracks of the carrier element. As an alternative to this, the method of "wire bonding" or the like can also be employed in order to produce the electrical connection between the integrated circuit and the carrier element. If appropriate, a separate device—for example a heating device—may be necessary for curing the compensating layer with an increase in volume if this is not contained in the chemical reaction of the material itself which forms the compensating layer.

A foamable silicone material or a foamable epoxide material is preferably used as material for the compensating layer and is injected by the device for coating. In addition, other materials having the desired foamable properties for forming the stress-absorbing compensating layer are also conceivable.

Other features which are considered as characteristic for the invention are set forth in the appended claims.

Although the invention is illustrated and described herein as embodied in a method for applying a semiconductor chip to a carrier element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
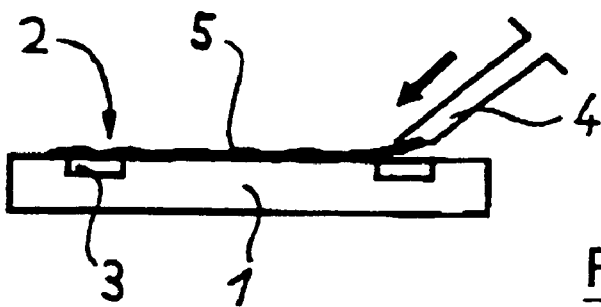
FIG. 1 is a diagrammatic, sectional view of a first method step for applying an integrated circuit to a carrier element, in which a compensating layer is coated onto the integrated circuit according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated circuit 1 which has a lower contact area 2. Contact points 3 for electrically linking the integrated circuit 1 within a circuit of an electronic device are disposed on the lower contact area 2. Using a coating device 4, an adhesion-promoting material of paste-like consistency, which later forms a compensating layer 5, is coated substantially with full coverage, leaving the electrical contact points 3 free, onto the contact area 2. In this exemplary embodiment, the coating device 4 is a cylinder configuration or printing device that contains the material of the compensating layer 5 and releases the material via an outlet opening due to an applied pressure. A foamable silicone material is used as the material in this exemplary embodiment.

Figure 2:
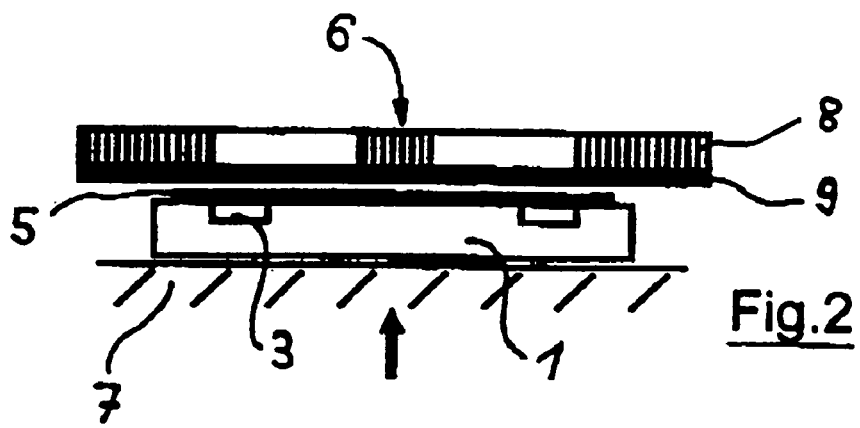
FIG. 2 is sectional view of a second method step for application purposes, in which the carrier element is joined together with the integrated circuit.

According to FIG. 2, the integrated circuit 1 is subsequently joined together, by the compensating layer 5, with a flexible carrier element 6 after relative alignment. The relative alignment between the integrated circuit 1 and the carrier element 6 and also the joining-together process are effected by a placement device 7. A pick-and-place device is suitable as the placement device 7. A polyimide film 8 with conductor tracks 9 made of copper, which forms a rewiring plane, is used as the flexible carrier element 6.

Figure 3:
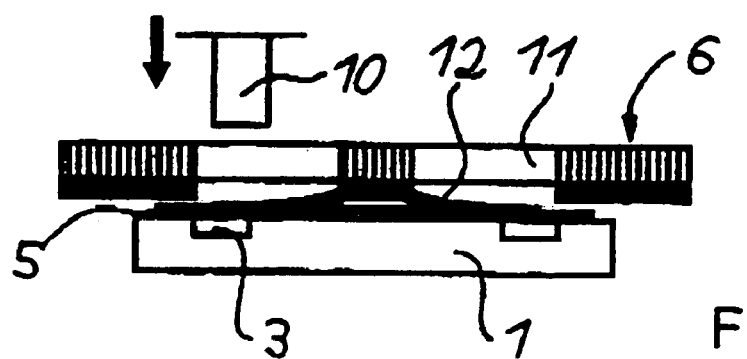
FIG. 3 is a sectional view of a third method step for application purposes, in which electrical linking of the integrated circuit is produced.

In accordance with FIG. 3, the electrical connection between the integrated circuit 1 and the conductor tracks 9 of the carrier element 6 is produced by a wiring device 10 over the provisional thickness of the compensating layer 5. The wiring device 10 is configured as a "bonding device" and, through window-like openings 11 provided in the polyimide film 8, breaks out electrical lines 12 as small copper strips from the conductor tracks 9. The electrical lines 12 are fastened to the electrical contact points 3 of the integrated circuit 1 by use of ultrasound in such a way that they initially have an arc-like or wave-like and in this respect untautened configuration. In this method step, the electrical lines 12 lie substantially flat within the compensating layer 5.

Figure 4:
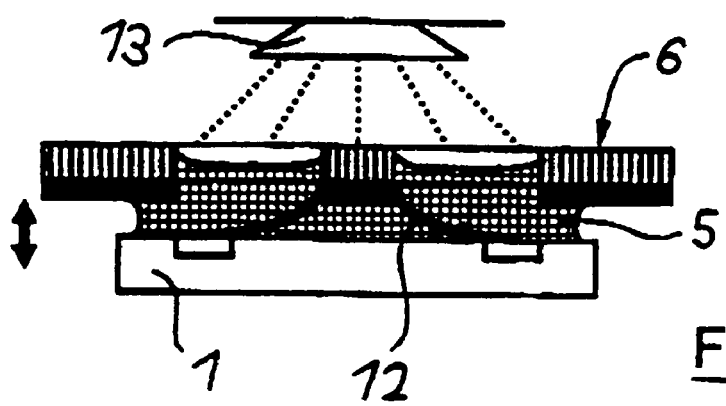
FIG. 4 is a sectional view of a fourth method step for application purposes, in which the compensating layer is cured.

Finally, the compensating layer 5 is cured according to FIG. 4. In this case, the curing is effected with an increase in volume. In this exemplary embodiment, the increase in volume is achieved by a substance that liberates gas during the curing process. The substance is admixed as a kind of blowing agent with the material forming the compensating layer 5—that is to say in this case the silicone material—in order to make the material foamable. The volume-increasing process is brought about in a defined manner by an external device for curing the compensating layer 5. In this case, an UV lamp 13 is used as a curing device 13. The UV lamp 13 is disposed in such a way that at least an effective part of the material of the compensating layer 5 is exposed to irradiation, so that the increase in volume can be reliably effected. The electrical lines 12, which were previously situated flat in the compensating layer 5, are tautened on account of the increase in volume. During the tautening process, the electrical lines 12 that are already electrically and mechanically connected to the integrated circuit 1 adopt a straightened position with regard to the surface of the carrier element 6 or the contact area 2 of the integrated circuit 1. The effective length of the electrical lines 12 in this case establishes a minimum thickness of the compensating layer 5 which is necessary in order to ensure a sufficiently elastic layer property, so that it is possible to absorb the thermomechanical stresses occurring on account of operation-dictated temperature differences between the integrated circuit 1 and the carrier element 6. Consequently, in particular the risk of tearing of the electrical lines 12 connecting the integrated circuit 1 to the carrier element 6 at the electrical contact points 3 is averted.

The invention is not restricted solely to the exemplary embodiment described above. Rather, variants thereof are also conceivable which make use of the invention even in the case of fundamentally differently configured embodiments.

We claim:

1. A method for applying a first device to a second device, which comprises the steps of:
    providing an integrated circuit having a lower contact area;
    providing a carrier element having conductor tracks;
    coating a curable compensating layer having an initially pasty consistency substantially with full coverage onto one of the lower contact area of the integrated circuit and onto the carrier element;
    subsequently joining the integrated circuit in an adhering manner, due to the curable compensating layer, to the carrier element after relative alignment;
    producing an electrical connection between the integrated circuit and the conductor tracks of the carrier element via electrical lines surmounting a thickness of the curable compensating layer; and
    curing the curable compensating layer resulting in an increased volume of the curable compensating layer.

2. The method according to claim 1, which comprises fastening the electrical lines in an untautened manner between the integrated circuit and the carrier element, so that the electrical lines are tautened during an increase in the volume of the curable compensating layer.

3. The method according to claim 1, which comprises increasing the volume of the curable compensating layer by introducing a gas during one of the coating step and the curing step.

4. The method according to claim 1, which comprises increasing the volume of the curable compensating layer by a substance which liberates gas during the curing process and is admixed with a material forming the curable compensating layer.

5. The method according to claim 1, which comprises increasing a temperature of the curable compensating layer for assisting in the curing step.

6. The method according to claim 1, which comprises irradiating the curable compensating layer with ultraviolet light during the curing step.

7. The method according to claim 2, which comprises fastening the electrical lines using a bonding method.

* * * * *